United States Patent
Huang et al.

[11] Patent Number: 5,828,111
[45] Date of Patent: Oct. 27, 1998

[54] INCREASE RESISTANCE OF A POLYSILICON LOAD RESISTOR, IN AN SRAM CELL

[75] Inventors: Jenn Ming Huang, Hsin-Chu; Yi-Miaw Lin, Taipei, both of Taiwan

[73] Assignee: Taiwan Semiconductor Manufacturing Company, Ltd., Hsin-Chu, Taiwan

[21] Appl. No.: 984,839

[22] Filed: Dec. 4, 1997

Related U.S. Application Data

[62] Division of Ser. No. 775,072, Dec. 27, 1996, Pat. No. 5,721,166.

[51] Int. Cl.$^6$ .............................. H01L 29/76; H01L 29/94
[52] U.S. Cl. ...................... 257/377; 257/358; 257/360; 257/903; 438/238; 438/385
[58] Field of Search ............................ 257/358, 360, 257/377, 380, 903, 904; 438/238, 385

[56] References Cited

U.S. PATENT DOCUMENTS

| | | | |
|---|---|---|---|
| 5,146,107 | 9/1992 | Matsuoka et al. | 307/253 |
| 5,424,239 | 6/1995 | Sweeney | 437/60 |
| 5,461,000 | 10/1995 | Liang | 437/60 |
| 5,554,552 | 9/1996 | Chi | 437/43 |
| 5,554,554 | 9/1996 | Bastani et al. | 437/47 |

*Primary Examiner*—Valencia Martin-Wallace
*Attorney, Agent, or Firm*—George O. Saile; Stephen B. Ackerman

[57] ABSTRACT

A method for fabricating polysilicon load resistors, with increased resistance values, for use in SRAM cells, has been developed. An underlying, raised grid topography is used to allow the overlying polysilicon load resistor to traverse the severe topography, resulting in an increase in resistor length, while still maintaining the allotted design space, overlying a MOSFET device. The formation of back to back diodes in the polysilicon load resistor also results in an increase in resistance. The back to back diodes are created via N type, ion implantation into only flat regions of an intrinsic, or P type doped, polysilicon load resistor, regions in which the polysilicon load resistor overlaid the flat regions of the underlying raised grid topography, leaving regions of the polysilicon load resistor, located on the sides of the underlying raised grid topography, P type.

4 Claims, 5 Drawing Sheets

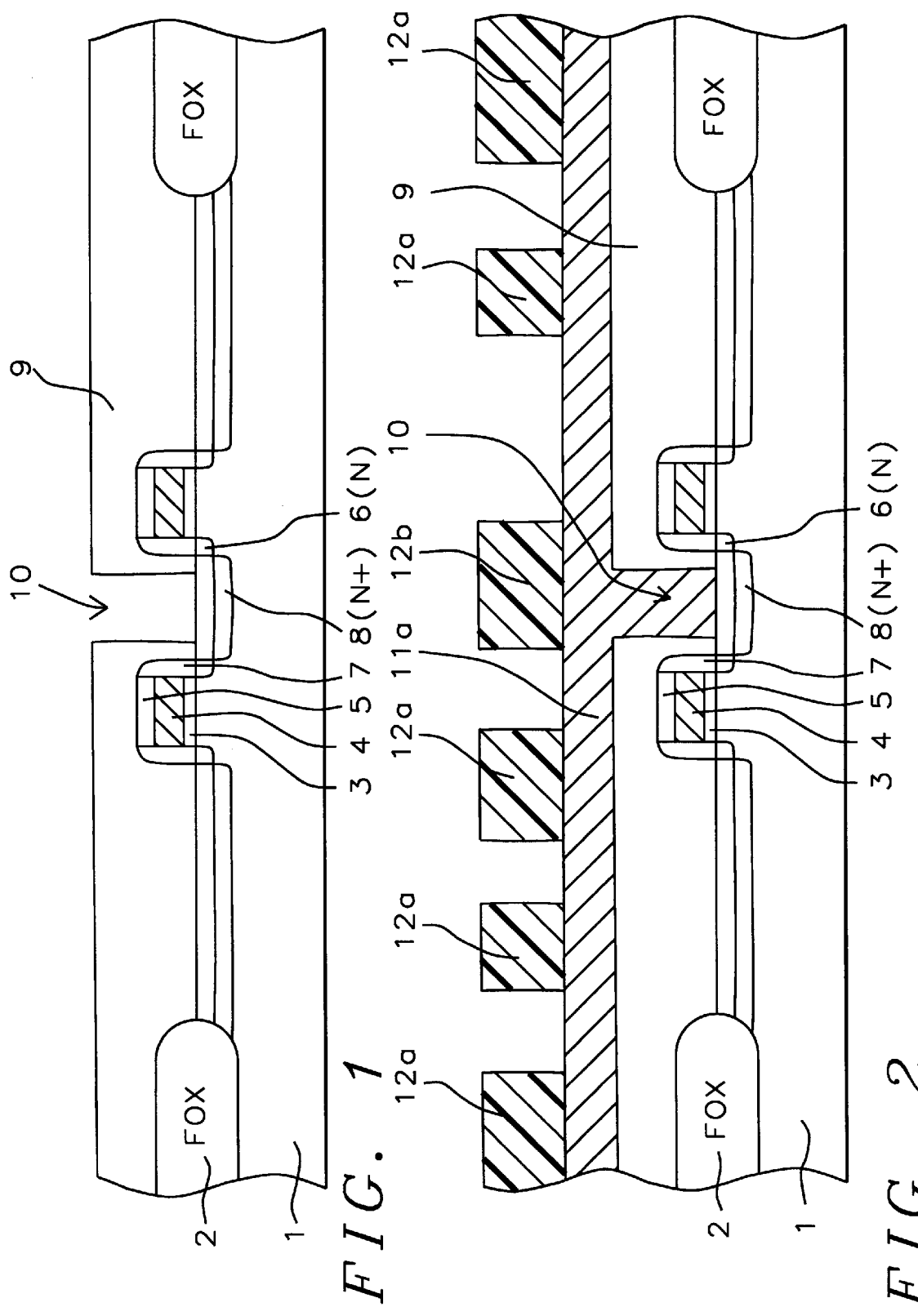

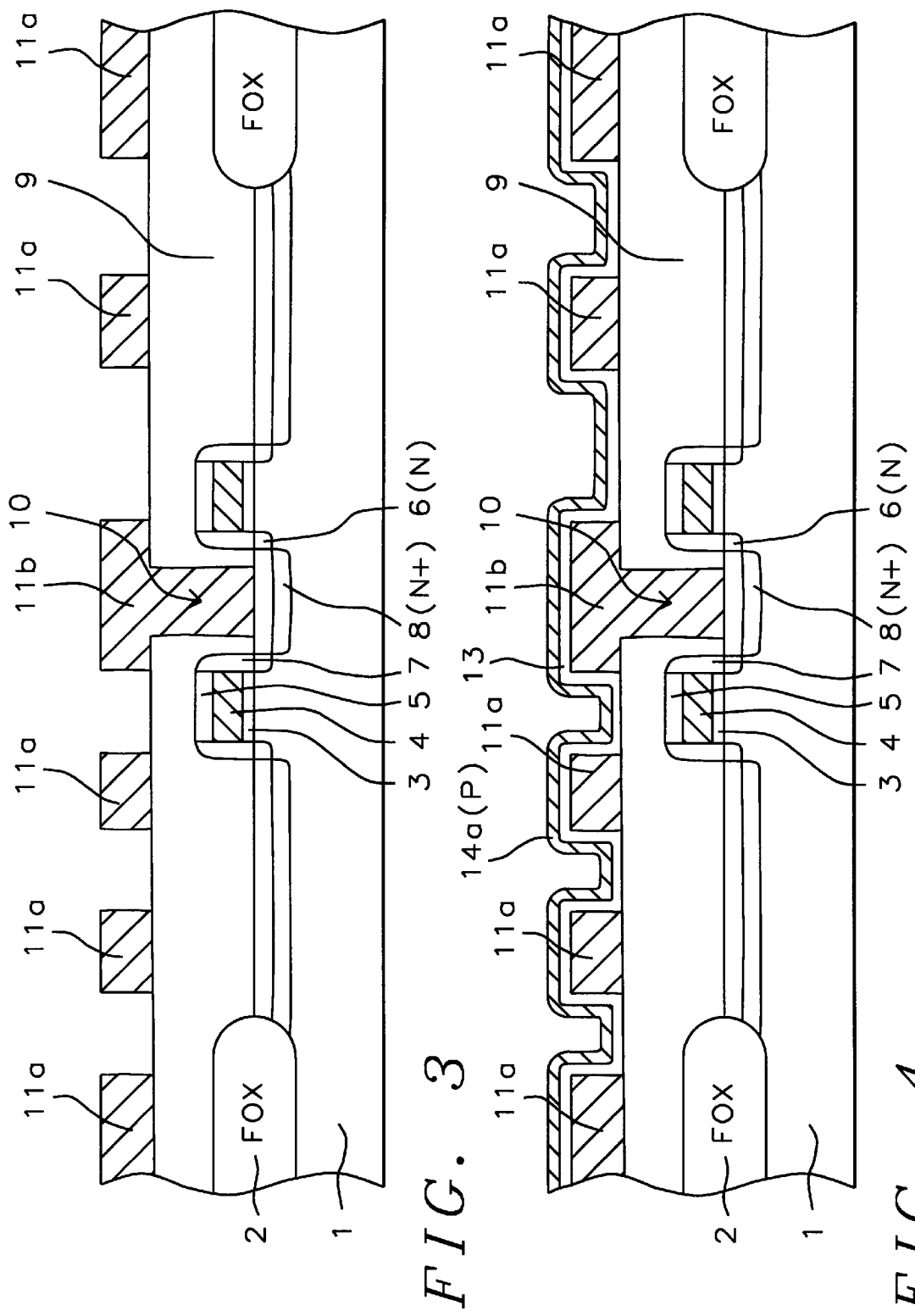

INCREASE RESISTANCE OF A POLYSILICON LOAD RESISTOR, IN AN SRAM CELL

This is a division of patent application Ser. No. 08/775,072, filing date Dec. 27, 1996, now U.S. Pat. No. 5,721,166 Method To Increase The Resistance Of A Polysilicon Load Resistor, In An Sram Cell, assigned to the same assignee as the present invention.

BACKGROUND OF THE INVENTION

(1) FIELD OF THE INVENTION

The present invention relates to a method of fabricating metal oxide semiconductor, (MOSFET), devices, on a semiconductor substrate, for use in a static random access memory, (SRAM), cell, and more specifically to a process used to form polysilicon load resistors, for the SRAM cell, using doping procedures and topography to enhance the resistance of the polysilicon load resistor.

(2) DESCRIPTION OF THE PRIOR ART

Static random access memory, (SRAM), cells are now being manufactured using high speed, high density, MOSFET devices. Conventional SRAM cells are usually configured using either four, n-channel, and two, p-channel, MOSFET devices, or via use of four, n-channel, MOSFET devices, with two load resistors, used in place of the p-channel devices. The use of the load resistors, in place of the p-channel MOSFET devices, consumes less area then the complimentary MOSFET counterparts, and therefore has found extensive use in advanced SRAM designs. A triple polysilicon process has frequently been used to accommodate the load resistor option for SRAM cells. In this process a first polysilicon layer is used for the gate structure of the MOSFET device, while a second polysilicon layer is used as a local interconnect, as well as a contact structure to a source and drain region of an underlying n-channel MOSFET device. A third polysilicon layer is used for creation of the load resistors. In order to enhance or increase the resistance of the polysilicon device, which is needed for many SRAM designs, the doping level of the polysilicon layer has to be decreased, or the length of the load resistor has to be increased. Difficulties in controlling lower dopant levels in polysilicon layers, do not allow low doped, polysilicon load resistors, to be easily fabricated. In addition the option of increasing the length of the polysilicon load resistor is limited by the finite dimensions presented in advanced SRAM designs.

This invention will present a process in which the resistance of polysilicon load resistors can be increased, without consuming additional area, and without the use of a less controllable, low doping procedure. This invention will show the use of underlying topography, resulting from an underlying grid pattern, allowing the load resistor to traverse this topography, thus increasing length and resistance of the load resistor. In addition doping of the polysilicon layer is performed to create back to back diodes, in the polysilicon load resistor, again resulting in a higher load resistance then counterparts fabricated without the back to back diode procedure. Prior art, such as Sweeny, in U.S. Pat, No. 5,424,239, shows a method of forming polysilicon resistors with alternating doped and undoped regions, however that invention does not teach the process of lengthening the resistor via an underlying topography, nor does it show a process for achieving back to back diodes, again via the use of the severe underlying topography.

SUMMARY OF THE INVENTION

It is an object of this invention to fabricate MOSFET devices, for an SRAM cell, in which a polysilicon load resistor is created, in an area of the MOSFET device, overlying the transfer gate transistor of the MOSFET device.

It is another object of this invention, to create a grid pattern in an underlying local interconnect level, resulting in a raised grid topography.

It is still another object of this invention to increase the length, and therefore the resistance, of a polysilicon load resistor, by allowing the polysilicon load resistor to traverse the underlying raised grid topography.

It is still yet another object of this invention to form back to back diodes in a polysilicon load resistor, via the use of a blanket ion implantation process, resulting in the doping of only the flat portions of the polysilicon load resistor, while portions of the polysilicon load resistor, on the sides of the raised grid topography, remain undoped.

In accordance with the present invention a method is described in which the resistance of a polysilicon load resistor, used with MOSFET devices, for SRAM cells, is increased via increasing the length of the resistor, by forming the resistor on an underlying raised grid pattern, and by forming back to back diodes in the polysilicon load resistor. A transfer gate transistor, for a MOSFET device, is created by: forming a polysilicon gate structure, from a first polysilicon layer, on an underlying gate insulator layer; forming a lightly doped source and drain region in the semiconductor substrate, not covered by the polysilicon gate structure; forming an insulator spacer on the sides of the polysilicon gate structure; and creating heavily doped source and drain regions, in the region of the semiconductor substrate not covered by the polysilicon gate structure or insulator spacers. A first interlevel dielectric layer is deposited, and a contact hole is opened in the first interlevel dielectric layer, to expose a heavily doped region, between polysilicon gate structures. A second polysilicon layer is deposited and patterned, using photolithographic and reactive ion etching, (RIE), procedures, to create: a local interconnect level, including the contact structure to the underlying heavily doped source and drain region; and a series of polysilicon mesas, on the underlying first interlevel dielectric layer, created to result in a raised grid topography, on the underlying first interlevel dielectric layer. A second dielectric layer is deposited on the underlying, raised grid topography, followed by the deposition of a third polysilicon layer, grown using a P type, in situ doping procedure, or grown intrinsically and doped P type, and traversing the underlying, raised grid topography. Photolithographic and RIE procedures are then used to pattern the third polysilicon layer. A heavily doped, N+, ion implantation is performed, in regions of the third polysilicon layer to be used for contact areas to the subsequent polysilicon load resistor. A blanket, N type, ion implantation procedure, is then performed, creating N type regions in the flat regions of the third polysilicon layer, while regions of third polysilicon layer, located on the sides of the raised grid topography, do not experience the N type ion implantation procedure, and remain P type. The polysilicon load resistors, with the desired polysilicon resistor lengths, now exhibit resistances increased as a result of traversing the underlying, raised grid topography, and resistance also increased as a result of back to back diode formation.

BRIEF DESCRIPTION OF THE DRAWINGS

The object and other advantages of this invention are best described in the preferred embodiment with reference to the attached drawings that include:

FIGS. 1–7, which schematically in cross-sectional style, present the key fabrication stages of the polysilicon load resistor, overlying a MOSFET device, and used for an SRAM cell, in which the resistance of polysilicon load resistor is increased as a result of the polysilicon load resistor traversing an underlying, raised grid topography, as well as the use of back to back diodes in the polysilicon load transistor.

DESCRIPTION OF THE PREFERRED EMBODIMENTS

Figure 5:
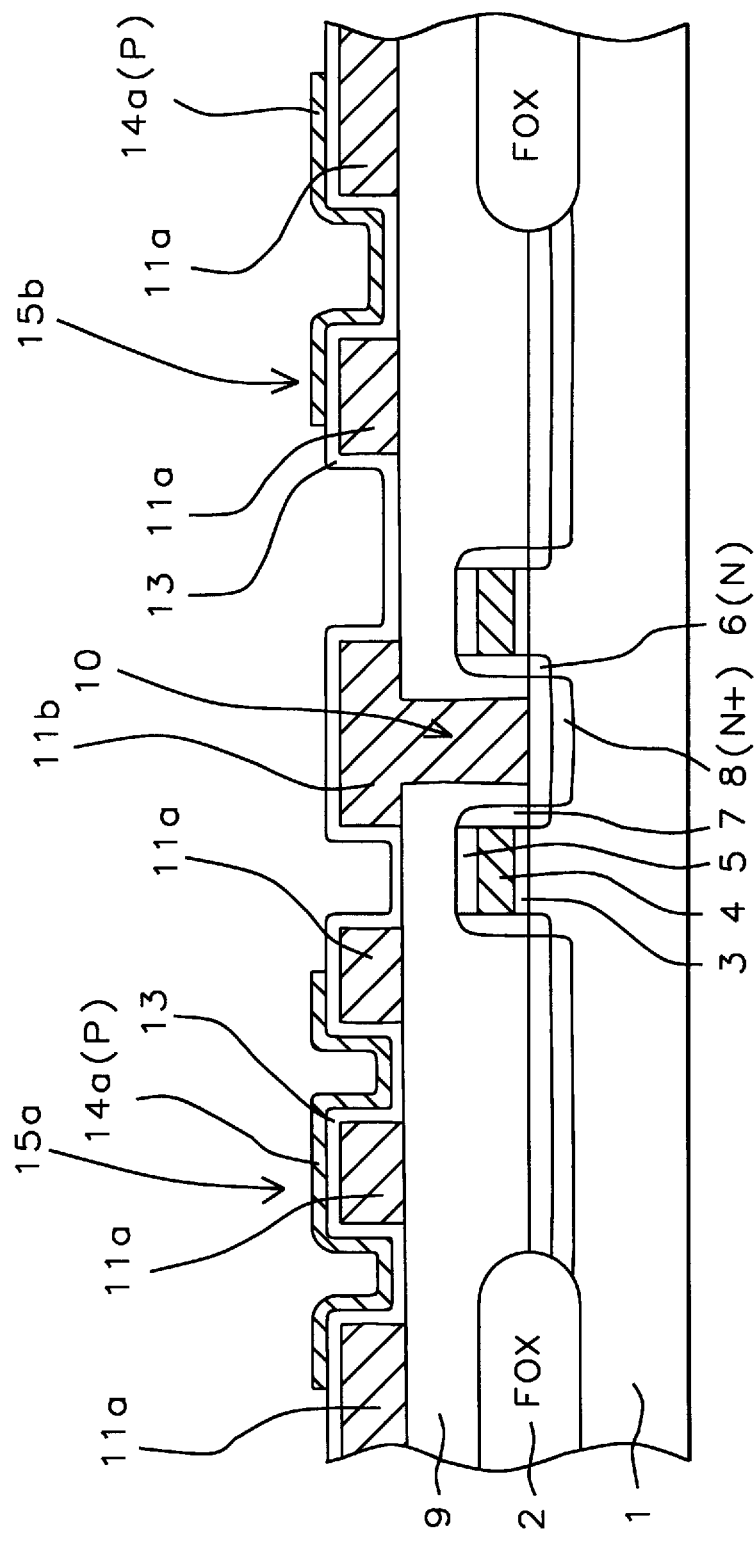

The method of fabricating a polysilicon load resistor, overlying a MOSFET device, used for an SRAM cell, in which the resistance of the polysilicon load resistor is increased by increasing the length of the resistor, by formation of the resistor on an underlying, raised grid topography, as well as increasing the resistance of the polysilicon load resistor by forming back to back diodes in the polysilicon load resistor, will be described.

FIG. 1, schematically shows the transfer gate transistor used for the MOSFET device, which underlies the enhanced polysilicon load resistors, described in this invention. This embodiment uses an n-channel, MOSFET device, however if desired a p-channel, MOSFET device, can also used with this invention, by simply changing conductivity type for source and drain regions. A P type, single crystalline, silicon substrate, 1, with a <100> crystallographic orientation, is used. Field oxide, (FOX), regions, 2, are used for purposes of isolation. FOX regions, 2, are formed to a thickness between about 3000 to 5000 Angstroms, via thermal oxidation of exposed regions of silicon substrate, 1, in an oxygen-steam ambient, at a temperature between about 850 to 1050° C. Non-oxidized regions, of silicon substrate, 1, are protected by a composite oxidation mask of silicon nitride-silicon oxide, created by forming the desired pattern in the chemically vapor deposited silicon nitride-silicon oxide layers, using conventional photolithographic and RIE procedures. After formation of the FOX regions, 2, the composite oxidation mask, silicon nitride-silicon oxide, is removed and a gate insulator layer, of silicon dioxide, 3, is thermally grown in an oxygen-steam ambient, at a temperature between about 850 to 1000° C., to a thickness between about 50 to 200 Angstroms. A first layer of polysilicon, 4, is next deposited using low pressure chemical vapor deposition, (LPCVD), procedures, at a temperature between about 500 to 700° C., to a thickness between about 1500 to 3500 Angstroms. Polysilicon layer, 4, can be grown intrinsically and doped via ion implantation procedures, using arsenic or phosphorous, at an energy between about 30 to 75 KeV, at a dose between about 1E14 to 1E16 atoms/cm$^2$, or polysilicon layer, 4, can be deposited using in situ doping procedures by adding either phosphine or arsine, to the silane ambient. A silicon oxide layer, 5, is next deposited, using either LPCVD or plasma enhanced chemical vapor deposition, (PECVD), procedures, at a temperature between about 500 to 700° C., to a thickness between about 1000 to 3000 Angstroms, using tetraethylorthosilicate, (TEOS), as a source. Conventional photolithographic and RIE procedures, using CHF$_3$ as an etchant for silicon oxide layer, 5, and Cl$_2$ as an etchant for polysilicon layer, 4, are used to create polysilicon gate structures, comprised of silicon oxide layer, 5, and polysilicon layer, 4, shown schematically in FIG. 1.

After removal of the photoresist shape, used for patterning the polysilicon gate structures, via plasma oxygen ashing and careful wet cleans, a lightly doped source and drain region, 6, is created via ion implantation of either phosphorous or arsenic, at an energy between about 25 to 75 KeV, at a dose between about 5E13 to 5E13 atoms/cm$^2$. Another silicon oxide layer is then deposited, using LPCVD or PECVD procedures, at a temperature between about 500 to 700° C., to a thickness between about 1500 to 3000 Angstroms, using TEOS as a source, followed by an anisotropic RIE procedure, using CHF$_3$ as an etchant, to create silicon oxide spacers, 7, on the sides of the polysilicon gate structures, shown schematically in FIG. 1. Heavily doped source and drain regions, 8, are next created visa ion implantation of either arsenic or phosphorous, at an energy between about 50 to 100 KeV, at a dose between about 1E14 to 1E16 atoms/cm$^2$. A first interlevel dielectric layer, 9, of silicon oxide, is deposited using LPCVD or PECVD procedures, at a temperature between about 500 to 700° C., to a thickness between about 3000 to 7000 Angstroms, using TEOS a source. Photolithographic and RIE procedures, using CHF$_3$ as an etchant, are used to open contact hole, 10, in the first interlevel dielectric layer, 9, exposing heavily doped source and drain region, 8, located between polysilicon gate structures, and schematically shown in FIG. 1. Photoresist removal is again performed using plasma oxygen ashing and careful wet cleans.

A second layer of polysilicon, 11a, shown schematically in FIG. 2, is next deposited, again via LPCVD procedures, at a temperature between 500 to 700° C., to a thickness between about 300 to 3000 Angstroms. Polysilicon layer, 11a, can either be deposited intrinsically, and doped via ion implantation of phosphorous or arsenic, at an energy between about 25 to 50 KeV, at a dose between about 1E13 to 1E15 atoms/cm$^2$, or polysilicon layer, 11a, can be deposited using in situ doping procedures, by the addition of either phosphine or arsine, to the silane ambient. Photoresist shape, 12b, is then formed to be used as a mask to define subsequent interconnect polysilicon levels, and to define a subsequent polysilicon contact structure. Photoresist shapes, 12a, are also formed, to be used as a mask to define the subsequent polysilicon shapes, that will form a raised grid topography, consisting of polysilicon mesas. These photoresist shapes are schematically shown in FIG. 2. An anisotropic RIE procedure, using Cl$_2$ as an etchant, is next employed to etch second polysilicon layer, 11a, creating a local interconnect level, as well as polysilicon contact structure, 11b, contacting heavily doped source and drain region, 8, between polysilicon gate structures. The anisotropic RIE procedure also creates polysilicon mesas, 11a. The series of polysilicon mesas, 11a, located on the top surface of first interlevel dielectric layer, 9, result in a raised grid topography, with the level of topography resulting from the height of polysilicon mesas, 11a, or the thickness of the second polysilicon layer, between about 300 to 3000 Angstroms. The spacing between polysilicon mesas is between about 3000 to 8000 Angstroms. FIG. 3, schematically shows the defined polysilicon structures, after removal of photoresist shapes, 12a and 12b via, use of plasma oxygen ashing and careful wet cleans.

A second interlevel dielectric layer, 13, of silicon oxide, is deposited using either LPCVD or PECVD procedures, at a temperature between about 500 to 700° C., to a thickness between about 500 to 3000 Angstroms, using TEOS as a source. Second interlevel dielectric layer, 13, contours, and completely passivates the underlying polysilicon mesas, 11a, as well as polysilicon contact structure, 11b. This is schematically shown in FIG. 4. A critical, third polysilicon layer, 14a, to be used for the subsequent polysilicon load resistor, is next deposited at a temperature between about 500 to 700° C., to a thickness between about 300 to 600 Angstroms. Third polysilicon layer, 14a, which contours the underlying, raised grid topography, created by polysilicon mesas, 11a, can be deposited intrinsically, to a thickness between about 500 to 700 Angstroms, exhibiting P type characteristics, or third polysilicon layer, 14a, can be deposited via in situ doping procedures, by the addition of diborane to the silane ambient, to a thickness between about 300 to 600 Angstroms. The P type doping level of third polysilicon layer, 14a, between about 1E12 to 5E13 atoms/$cm^2$, will be a factor in the formation of the back to back diodes, created in a subsequent polysilicon load resistor. Third polysilicon layer, 14a, is schematically shown in FIG. 4.

Photolithographic and RIE procedures, using $Cl_2$ as an etchant are used to define polysilicon load resistor, 15a, and polysilicon load resistor, 15b, schematically shown in FIG. 5, after photoresist removal using plasma oxygen ashing and careful wet cleans.

Figure 6:
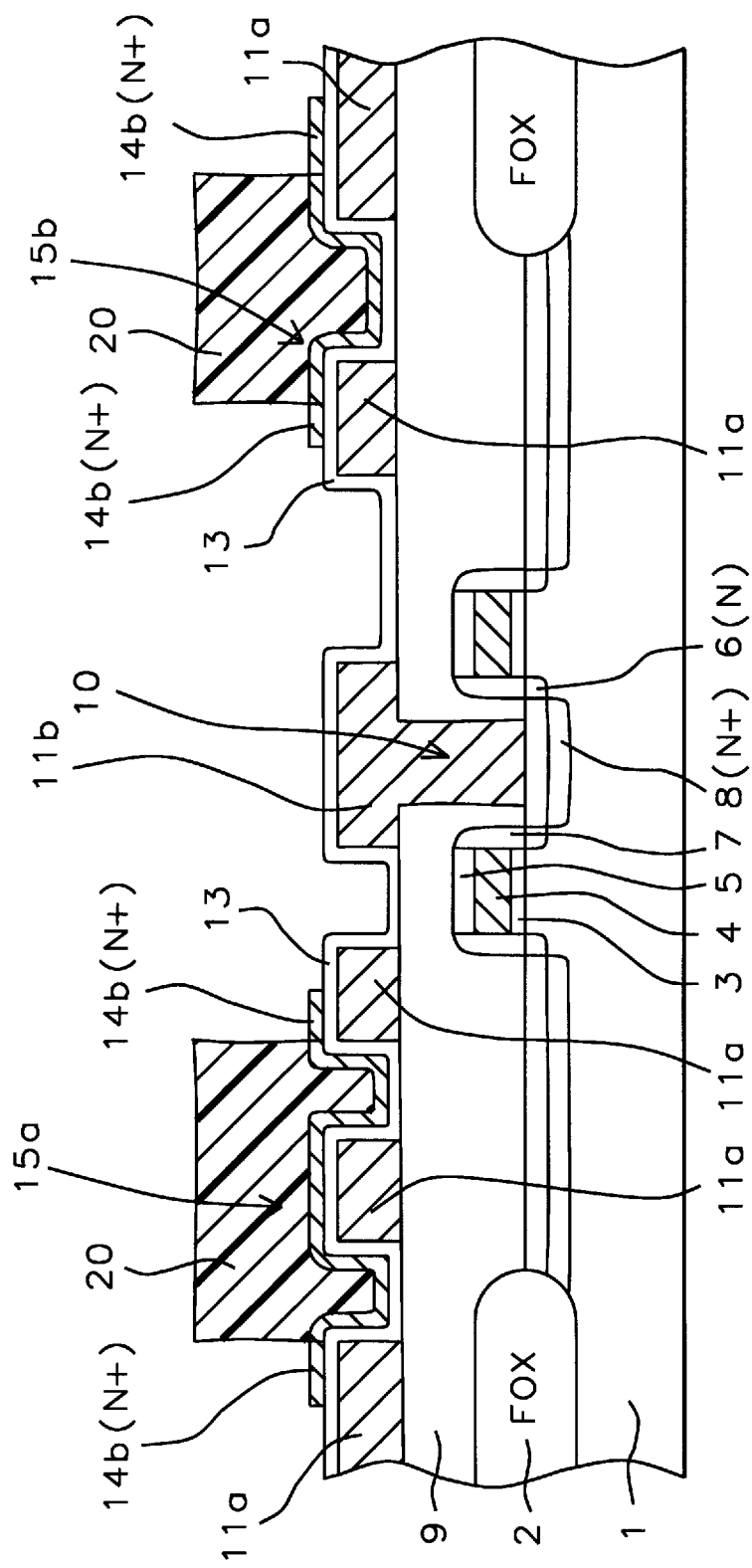

Regions of the subsequent polysilicon load resistor, to be used for contact purposes, are next addressed. Photoresist shapes, 20, are formed, and used as a mask to protect the P type portions of third polysilicon layer, 14a, from an ion implantation of either phosphorous or arsenic, at an energy between about 10 to 30 KeV, at a dose between about 1E14 to 5E15 atoms/$cm^2$, used to create N+ regions, 14b, in the third polysilicon layer, 14a, shown schematically in FIG. 6. Photoresist shapes, 20, are then removed using plasma oxygen ashing and careful wet cleans.

Figure 7:
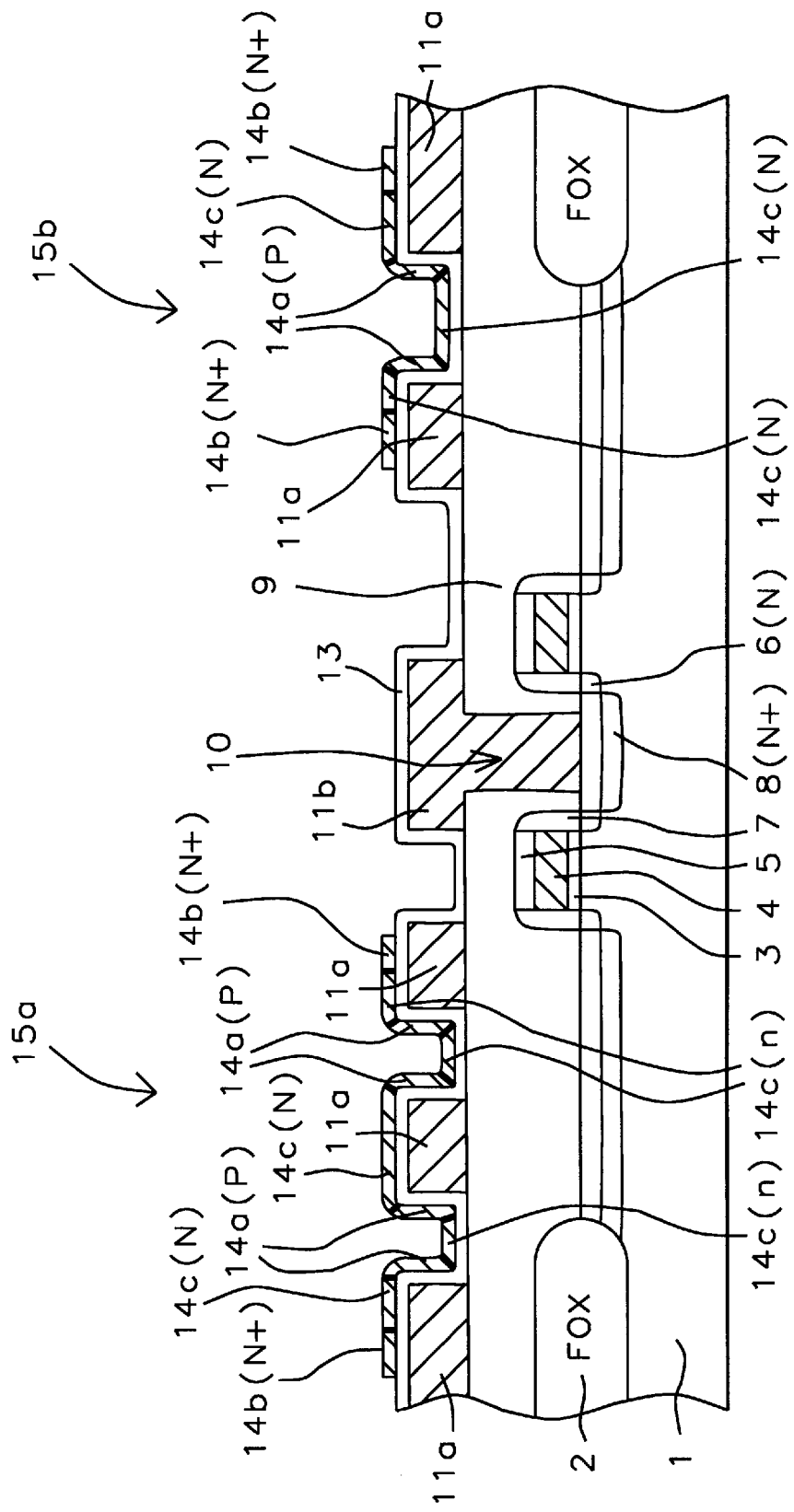

The back to back diodes, in third polysilicon layer, 14a, are next created via a blanket ion implantation procedure, using arsenic or phosphorous, at an energy between about 10 to 30 KeV, at a dose between about 5E13 to 5E14 atoms/$cm^2$, and at an implant angle between about 0 to 7°. This procedure converts the P type portions, only on the flat portions of third polysilicon layer, 14a, to an N type region, 14c. The ion implantation procedure is unable to convert the P type portions, of third polysilicon layer, 14a, to N type regions, 14c, in areas in which the third polysilicon layer is located on the sides of the raised grid topography, thus resulting in back to back diodes, of alternate, and connecting regions of N type, 14c, third polysilicon layer, and regions of P type, 14a, third polysilicon layer. This is schematically shown in FIG. 7.

Polysilicon load resistor, 15a, is comprised of back to back diode pairs, of N+-N-P-N-P-N-P-N-P-N-N+, (14b-14c-14a-14c-14a14c-14a-14c-14a-14c-14b). The resistance of polysilicon load resistor, 15a, has been increased as a result of the increased resistor length, obtained from polysilicon load resistor, 15a, traversing the raised grid topography. The resistance of polysilicon load resistor, 15a, has also been increased as a result of the inclusion of the back to back diodes pairs. Polysilicon resistor load, 15b, has been shown for this invention, to also experience resistance increases as a result of traversing the raised grid topography, and the inclusion of the dopants to form the diodes in the polysilicon load resistor. However the desired design, described in this invention, required a resistance for polysilicon load resistor, 15b, less then the desired resistance for polysilicon load resistor, 15a. Therefore the length of polysilicon load resistor, 15b, is shorter then counterpart, polysilicon load resistor, 15a, and with only one pair of back to back diodes.

While this invention has been particularly shown and described with reference to, the preferred embodiments thereof, it will be understood by those skilled in the art that various changes in form and details may be made without departing from the spirit and scope of this invention.

What is claimed is:

1. A polysilicon load resistor structure, for an SRAM cell, traversing an underlying raised grid topography, and overlying a MOSFET device, comprised of:

a smooth, first interlevel dielectric layer, overlying said MOSFET device;

a contact hole in said first interlevel dielectric layer, filled with a polysilicon contact structure, with a polysilicon contact structure, contacting a source region, of a heavily doped source/drain region of said MOSFET device;

a raised grid topography, comprised of a series of polysilicon mesas on said first dielectric layer;

a second interlevel dielectric layer on said raised grid topography;

a first polysilicon load resistor, on a first portion of said second interlevel dielectric layer, traversing the topography created by the underlying, said raised grid topography, and comprised of a series of back to back diodes in said polysilicon load resistor; and a second polysilicon load resistor, on a second portion of said second interlevel dielectric layer, traversing the topography created by the underlying, said raised grid topography, and comprised of a set of back to back diodes, in said polysilicon load resistor.

2. The polysilicon load resistor structure of claim 1, wherein the underlying, said raised grid topography is comprised of said polysilicon mesas, between about 300 to 3000 Angstroms in height, and with the spacing between said polysilicon mesas between about 3000 to 8000 Angstroms.

3. The polysilicon load resistor structure of claim 1, wherein the P type regions, of said back to back diode, is comprised of boron dopants, with a dose between about 1E12 to 5E13 atoms/$cm^2$, and is located only in areas in which said polysilicon load resistor resides on the sides of said raised grid topography.

4. The polysilicon load resistor structure of claim 1, wherein the N type regions, of said back to back diode, is comprised of either phosphorous or arsenic dopants, with a dose between about 5E13 to 5E14 atoms/$cm^2$, and is located only in areas in which said polysilicon load resistor resides on the flat regions of said raised grid topography.

* * * * *